(12) United States Patent
Sugaya

(10) Patent No.: US 10,340,883 B2
(45) Date of Patent: Jul. 2, 2019

(54) HIGH-FREQUENCY MODULE

(71) Applicant: Murata Manufacturing Co., Ltd., Nagaokakyo-shi, Kyoto-fu (JP)

(72) Inventor: Yukiteru Sugaya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/008,075

(22) Filed: Jun. 14, 2018

(65) Prior Publication Data
US 2018/0302061 A1 Oct. 18, 2018

Related U.S. Application Data

(63) Continuation of application No. PCT/JP2016/088322, filed on Dec. 22, 2016.

(30) Foreign Application Priority Data

Dec. 25, 2015 (JP) .................. 2015-253844

(51) Int. Cl.
*H03H 9/00* (2006.01)
*H03H 9/02* (2006.01)
*H03H 9/05* (2006.01)
*H03H 9/10* (2006.01)
*H03H 9/25* (2006.01)
(Continued)

(52) U.S. Cl.
CPC ........ *H03H 9/1085* (2013.01); *H03H 9/0009* (2013.01); *H03H 9/02913* (2013.01); *H03H 9/059* (2013.01); *H03H 9/0547* (2013.01); *H03H 9/1064* (2013.01); *H03H 9/1071* (2013.01); *H03H 9/14597* (2013.01);
(Continued)

(58) Field of Classification Search
CPC ............ H03H 9/0009; H03H 9/02913; H03H 9/0547; H03H 9/059; H03H 9/1064; H03H 9/1071; H03H 9/1085; H03H 9/1092; H03H 9/145; H03H 9/14597; H03H 9/25; H03H 9/64; H03H 9/6423; H03H 9/6483; H03H 9/6489
USPC ........... 333/133, 193–195; 310/313 R, 313 B
See application file for complete search history.

(56) References Cited

U.S. PATENT DOCUMENTS

2003/0090338 A1 5/2003 Muramatsu
2004/0232802 A1 11/2004 Koshido
(Continued)

FOREIGN PATENT DOCUMENTS

JP 2003-198325 A 7/2003
JP 2004-129223 A 4/2004
(Continued)

OTHER PUBLICATIONS

Official Communication issued in International Patent Application No. PCT/JP2016/088322, dated Mar. 14, 2017.

*Primary Examiner* — Barbara Summons
(74) *Attorney, Agent, or Firm* — Keating & Bennett, LLP

(57) ABSTRACT

A high-frequency module includes a SAW filter including a piezoelectric substrate and an electrode pattern provided on the piezoelectric substrate, a module substrate, a resin member covering the SAW filter, and a wiring pattern connected to the electrode pattern and provided on the resin member. The electrode pattern and the wiring pattern are inductively coupled, capacitively coupled, or inductively coupled and capacitively coupled with each other.

17 Claims, 6 Drawing Sheets

(51) Int. Cl.
*H03H 9/64* (2006.01)
*H03H 9/145* (2006.01)

(52) U.S. Cl.
CPC ............ *H03H 9/25* (2013.01); *H03H 9/6483* (2013.01); *H03H 9/6489* (2013.01)

(56) References Cited

U.S. PATENT DOCUMENTS

| | | |
|---|---|---|
| 2010/0225202 A1 | 9/2010 | Fukano et al. |
| 2011/0080234 A1* | 4/2011 | Haruta .................. H03H 9/059 333/193 |
| 2013/0307639 A1* | 11/2013 | Mori ...................... H03H 9/725 333/133 |
| 2014/0118084 A1 | 5/2014 | Takemura |
| 2015/0042417 A1 | 2/2015 | Onodera et al. |
| 2016/0028365 A1 | 1/2016 | Takeuchi |

FOREIGN PATENT DOCUMENTS

| | | |
|---|---|---|
| JP | 2015-033080 A | 2/2015 |
| WO | 2009/057699 A1 | 5/2009 |
| WO | 2013/008435 A1 | 1/2013 |
| WO | 2014/168161 A1 | 10/2014 |

\* cited by examiner

HIGH-FREQUENCY MODULE

CROSS REFERENCE TO RELATED APPLICATIONS

This application claims the benefit of priority to Japanese Patent Application No. 2015-253844 filed on Dec. 25, 2015 and is a Continuation Application of PCT Application No. PCT/JP2016/088322 filed on Dec. 22, 2016. The entire contents of each application are hereby incorporated herein by reference.

BACKGROUND OF THE INVENTION

1. Field of the Invention

The present invention relates to a high-frequency module including a surface acoustic wave filter.

2. Description of the Related Art

A surface acoustic wave filter has been widely used as a band pass filter disposed at a front end portion of a mobile communication device, and the like. In addition, a multiplexer including a plurality of surface acoustic wave filters in order to support composite features, such as multimode/multiband features, has been put into practical use. The surface acoustic wave filter is required to have a function to allow a high-frequency signal within a pass band thereof to pass therethrough with low loss and to block a high-frequency signal outside the pass band thereof with high attenuation.

Japanese Unexamined Patent Application Publication No. 2015-33080 discloses a high-frequency module that includes a multilayer substrate including an inner wiring pattern having an inductance function, and a WLP (Wafer Level Package) surface acoustic wave filter disposed on the multilayer substrate. FIG. 6 is a cross-sectional structure diagram of the high-frequency module disclosed in Japanese Unexamined Patent Application Publication No. 2015-33080. The high-frequency module 800 shown in FIG. 6 includes a multilayer substrate 820 and a surface acoustic wave filter 801. The surface acoustic wave filter 801 includes a filter substrate 810, a cover layer 813, and a connection electrode 812. An IDT (InterDigital Transducer) electrode forming a filter portion 811 is formed on the front surface of the filter substrate 810, and the filter substrate 810 is disposed such that the front surface thereof faces a mounting surface of the multilayer substrate 820. An inductor 814 is pattern-formed in the cover layer 813 of the surface acoustic wave filter 801, and an inductor 822 is formed by an inner wiring pattern in the multilayer substrate 820. In the above configuration, the inductor 814 and the inductor 822 are inductively coupled with each other. Accordingly, it is possible to improve attenuation characteristics outside the pass band of the surface acoustic wave filter 801.

However, in the high-frequency module disclosed in Japanese Unexamined Patent Application Publication No. 2015-33080, in the case of achieving inductive coupling between an electrode pattern including an electrode wire and an IDT electrode within the surface acoustic wave filter and the inner wiring pattern in the multilayer substrate, there is a problem in that sufficient inductive coupling is not achieved, because the distance between the electrode pattern in the surface acoustic wave filter and the multilayer substrate is large.

SUMMARY OF THE INVENTION

Preferred embodiments of the present invention provide small-sized high-frequency modules having improved attenuation characteristics outside the pass band of a surface acoustic wave filter.

A high-frequency module according to a preferred embodiment of the present invention includes a module substrate; a surface acoustic wave filter disposed on a main surface of the module substrate and including a piezoelectric substrate and an electrode pattern provided on the piezoelectric substrate; a resin member covering the surface acoustic wave filter; and a wiring pattern connected to the electrode pattern and provided in or on the resin member, wherein the electrode pattern and the wiring pattern are inductively coupled, capacitively coupled, or inductively coupled and capacitively coupled with each other.

Accordingly, it is possible to couple the electrode pattern including IDT electrodes of the surface acoustic wave filter and a wiring electrode pattern connecting the IDT electrodes, and the wiring pattern provided in or on the resin member in contact with the surface acoustic wave filter across a narrow gap. Thus, it is possible to ensure strong coupling in a smaller space as compared to coupling between the electrode pattern and an inner wiring pattern in the module substrate. By a propagation path for signals outside a pass band which is provided by the strong coupling, it is possible to increase the attenuation outside the pass band. Thus, it is possible to achieve size reduction while improving the attenuation characteristics outside the pass band of the surface acoustic wave filter.

The wiring pattern may be provided in or on the resin member so as to overlap a portion of the electrode pattern when the main surface is seen in a plan view.

Accordingly, it is possible to couple the electrode pattern of the surface acoustic wave filter and the wiring pattern provided in or on the resin member across a narrower gap as compared to the case in which a wiring in the substrate and the electrode pattern of the surface acoustic wave filter are coupled with each other. Thus, it is possible to achieve size reduction while further improving the attenuation characteristics outside the pass band of the surface acoustic wave filter.

A distance between the wiring pattern and the electrode pattern may be smaller than a distance between the main surface and the electrode pattern when the module substrate is seen in cross-section.

Accordingly, it is possible to strengthen the coupling between the electrode pattern and the wiring pattern so as to be stronger than coupling between the electrode pattern and a wiring pattern provided in or on the module substrate. Thus, strong coupling is ensured in a smaller space as compared to a configuration in which the wiring pattern of the module substrate and the electrode pattern are coupled with each other.

The wiring pattern may be a shunt inductor connected to an input/output terminal of the surface acoustic wave filter and a ground terminal, and the wiring pattern and the electrode pattern may be inductively coupled, capacitively coupled, or inductively coupled and capacitively coupled with each other.

In particular, a propagation path for signals flowing in the shunt inductor which is provided by the inductive coupling, capacitive coupling, or inductive coupling and capacitive coupling is effective to increase the attenuation outside the pass band. Thus, it is possible to improve the attenuation characteristics outside the pass band of the surface acoustic wave filter.

The electrode pattern and the wiring pattern may be connected to each other via a first inner wiring pattern in the module substrate and a first columnar conductor penetrating the resin member, and the wiring pattern and the ground terminal may be connected to each other via a second columnar conductor penetrating the resin member and a second inner wiring pattern in the module substrate.

It is possible to locate the wiring pattern at any location in or on the resin member by using the first inner wiring pattern, the second inner wiring pattern, the first columnar conductor, and the second columnar conductor. That is, it is possible to improve or optimize the positional relationship between the electrode pattern and the wiring pattern. Thus, it is possible to achieve size reduction while improving the attenuation characteristics outside the pass band of the surface acoustic wave filter.

The surface acoustic wave filter may further include a support member provided on a front surface of the piezoelectric substrate to surround the electrode pattern, and a cover member provided on the support member and covering the electrode pattern so as to define a hollow space together with the support member and the piezoelectric substrate, and the module substrate, the cover member, the piezoelectric substrate, and the wiring pattern may be disposed in order in a direction perpendicular or substantially perpendicular to the main surface.

According to the above configuration, in the case in which the surface acoustic wave filter has a WLP structure, it is possible to structure the electrode pattern and the wiring pattern to oppose each other with the piezoelectric substrate interposed therebetween. That is, it is possible to reduce or minimize a gap providing coupling between the electrode pattern and the wiring pattern and set the gap as the thickness of the piezoelectric substrate. Thus, it is effective to improve the attenuation characteristics outside the pass band of the WLP surface acoustic wave filter while reducing the size thereof.

A grounded shield electrode may be provided on a surface of the cover member that is opposed to the module substrate or on a surface of the cover member that is opposed to the piezoelectric substrate.

Accordingly, since the shield electrode is disposed between the electrode pattern of the WLP type surface acoustic wave filter and the inner wiring pattern provided in the module substrate, it is possible to reduce or prevent unwanted mutual interference between the surface acoustic wave filter and the inner wiring pattern. In addition, since the shield electrode that reduces or prevents mutual interference does not need to be provided in or on the module substrate, it is possible to reduce the area of the module substrate. Thus, it is possible to reduce the size of the high-frequency module.

The shield electrode may overlap at least a portion of the electrode pattern when the module substrate is seen in a plan view.

Accordingly, it is possible to more effectively reduce or prevent unwanted mutual interference between the portion of the electrode pattern and the inner wiring pattern provided in the module substrate.

The shield electrode may overlap a region in which a third inner wiring pattern in the module substrate and the electrode pattern overlap each other, when the module substrate is seen in a plan view.

Accordingly, the shield electrode is interposed in the region in which the electrode pattern and the third inner wiring pattern overlap each other in the plan view, and thus it is possible to reduce or prevent unwanted mutual interference between the electrode pattern and the third inner wiring pattern with high accuracy.

The third inner wiring pattern may be an inductor connected to the electrode pattern and connected to a parallel resonator of the surface acoustic wave filter and the ground terminal, and inductive coupling, capacitive coupling, or inductive coupling and capacitive coupling between the third inner wiring pattern and the electrode pattern may be reduced or prevented by the shield electrode.

The third inner wiring pattern connected to the parallel resonator generates an attenuation pole outside the pass band, by defining a resonant circuit together with the resonator. When the third inner wiring pattern is further coupled with the electrode pattern, the attenuation pole generation function may be degraded or prevented. However, when the shield electrode is disposed between the electrode pattern and the third inner wiring pattern, it is possible to reduce or prevent deterioration of the attenuation characteristics outside the pass band.

In the high-frequency modules according to preferred embodiments of the present invention, it is possible to achieve size reduction while improving the attenuation characteristics outside the pass band of the surface acoustic wave filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
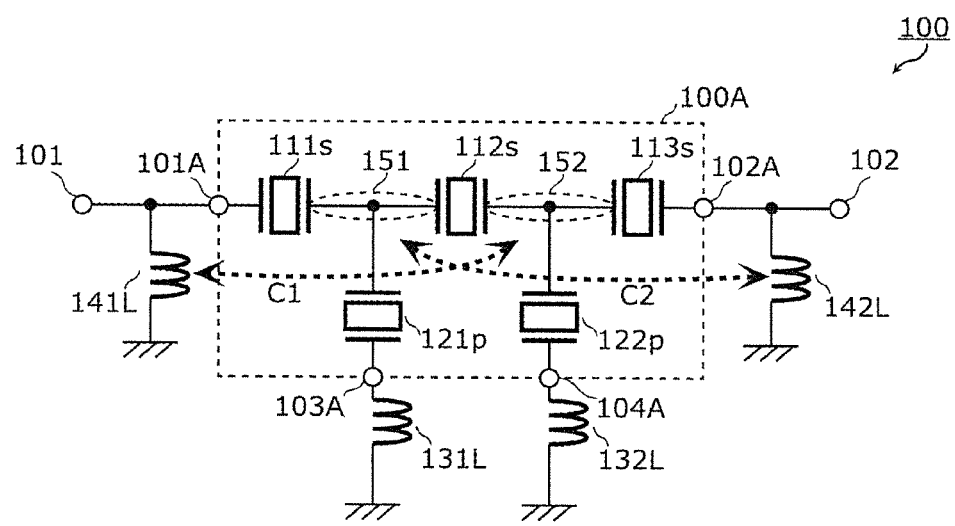
FIG. 1 is a circuit configuration diagram of a high-frequency module according to Preferred Embodiment 1 of the present invention.

Hereinafter, preferred embodiments of the present invention will be described in detail with reference to the drawings. The preferred embodiments described below each illustrate a comprehensive or specific example. Numerical values, shapes, materials, elements, the arrangement and the connection configuration of the elements, and other aspects described in the following preferred embodiments are merely examples, and are not intended to limit the present invention. Among the elements in the following preferred embodiments, elements that are not described in the independent claim are described as optional elements. The sizes of elements shown in the drawings and the ratio of the sizes are not necessarily precise.

Preferred Embodiment 1

FIG. 1 is a circuit configuration diagram of a high-frequency module 100 according to Preferred Embodiment 1 of the present invention. The high-frequency module 100 shown in FIG. 1 includes a surface acoustic wave (hereinafter, referred to as SAW) filter 100A, inductors 131L, 132L, 141L, and 142L connected to the SAW filter 100A, an input terminal 101, and an output terminal 102.

The SAW filter 100A is preferably a ladder band pass filter, for example, and includes series resonators 111s, 112s, and 113s and parallel resonators 121p and 122p. The series resonators 111s to 113s are connected in series to each other between a filter input terminal 101A and a filter output terminal 102A. In addition, the parallel resonators 121p and 122p are connected in parallel to each other between respective connection points of the series resonators 111s to 113s and filter reference terminals 103A and 104A.

The inductor 131L is connected between the filter reference terminal 103A and a ground terminal, and the inductor 132L is connected between the filter reference terminal 104A and the ground terminal. The inductors 131L and 132L each generate an attenuation pole outside the pass band of the SAW filter 100A by defining an LC resonant circuit together with a capacitance component of the SAW filter 100A.

The inductor 141L is connected between the ground and a wire connecting the input terminal 101 and the filter input terminal 101A to each other, and the inductor 142L is connected between the ground and a wire connecting the output terminal 102 and the filter output terminal 102A to each other. The inductor 141L provides impedance matching between the SAW filter 100A and a peripheral circuit (for example, an antenna circuit) connected to the input terminal 101, and the inductor 142L provides impedance matching between the SAW filter 100A and a circuit (for example, an amplifier circuit) connected to the output terminal 102.

The structure of the SAW filter 100A may not be a ladder structure, and can be any other structure including a resonator, such as a longitudinally-coupled filter, for example. In addition, the modes in which the inductors and capacitors are connected to the SAW filter 100A are not limited to the above modes.

Figure 2:
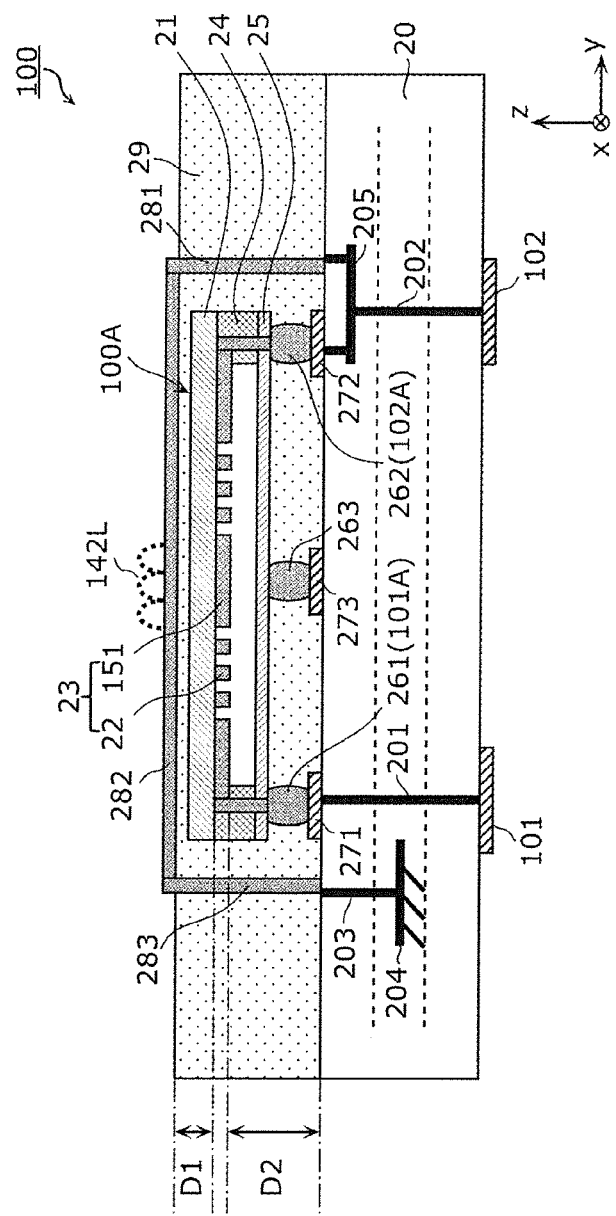
FIG. 2 is a cross-sectional structure diagram of the high-frequency module according to Preferred Embodiment 1 of the present invention.

FIG. 2 is a cross-sectional structure diagram of the high-frequency module 100 according to Preferred Embodiment 1. As shown in FIG. 2, the high-frequency module 100 includes a module substrate 20, the SAW filter 100A, a resin member 29, and a wiring pattern 282.

The SAW filter 100A includes a piezoelectric substrate and an electrode pattern 23 provided on the piezoelectric substrate 21. The electrode pattern 23 includes IDT (Inter-Digital Transducer) electrodes 22 having a comb shape and a connection wire 151 connecting the IDT electrodes 22. Each resonator shown in FIG. 1 includes the IDT electrode 22 and the piezoelectric substrate 21.

The SAW filter 100A according to the present preferred embodiment has a WLP (Wafer Level Package) structure and includes the piezoelectric substrate 21, the electrode pattern 23, a support member 24 provided on the front surface of the piezoelectric substrate 21 so as to surround the electrode pattern 23, and a cover member 25 that is provided on the support member 24 and covers the electrode pattern 23 so as to define a hollow space together with the support member 24 and the piezoelectric substrate 21. Due to this configuration, in the high-frequency module 100, the module substrate 20, the cover member 25, the piezoelectric substrate 21, and the wiring pattern 282 are disposed in order in a direction perpendicular or substantially perpendicular to the module substrate 20 (a z-axis direction).

The module substrate 20 is preferably a multilayer substrate including a plurality of layers laminated therein, and examples thereof include a ceramics multilayer substrate and a PCB substrate. On the front surface of the module substrate 20, a surface electrode 271 connected to a bump 261 that defines the filter input terminal 101A of the SAW filter 100A, a surface electrode 272 connected to a bump 262 that defines the filter output terminal 102A of the SAW filter 100A, and a surface electrode 273 connected to a bump 263 that defines a filter reference terminal (not shown) of the SAW filter 100A, are provided. In addition, the input terminal 101 and the output terminal 102 are provided on the back surface of the module substrate 20. The input terminal 101 is connected to the surface electrode 271 by a via-conductor 201, and the output terminal 102 is connected to the surface electrode 272 by a via-conductor 202 and an inner wiring pattern 205.

The resin member 29 covers the SAW filter 100A disposed on the module substrate 20. Examples of the material of the resin member 29 include resins, such as a thermosetting epoxy resin. The epoxy resin may preferably include an inorganic filler, such as $SiO_2$, for example.

The wiring pattern 282 is connected to the electrode pattern 23 and provided on the front surface of the resin member 29. Specifically, the wiring pattern 282 is connected to the electrode pattern 23 via a columnar conductor 281, the inner wiring pattern 205 (a first inner wiring pattern), the surface electrode 272, and the bump 262. The columnar conductor 281 is preferably a first columnar conductor penetrating the resin member 29 in the direction perpendicular or substantially perpendicular to the module substrate 20 (the z-axis direction) and is defined by, for example, a Cu pillar. Furthermore, the wiring pattern 282 is connected to a ground electrode 204 via a columnar conductor 283 and a via-conductor 203 (a second inner wiring pattern) in the module substrate 20. The columnar conductor 283 is preferably a second columnar conductor penetrating the resin member 29 in the direction perpendicular or substantially perpendicular to the module substrate 20 (the z-axis direction) and is defined by, for example, a Cu pillar.

Here, the wiring pattern 282 has an inductance component and defines, for example, the inductor 142L in FIG. 1. That is, the wiring pattern 282 is a shunt inductor 142L connected to the output terminal 102 of the SAW filter 100A and the ground terminal.

The wiring pattern 282 may not be provided on the front surface of the resin member 29 and may be provided within the resin member 29. That is, the wiring pattern 282 only needs to be connected to the electrode pattern 23 and associated with the resin member 29.

In addition, as shown in FIG. 2, the distance D1 between the wiring pattern 282 and the electrode pattern 23 is smaller than the distance D2 between the module substrate 20 and the electrode pattern 23.

Figure 3:
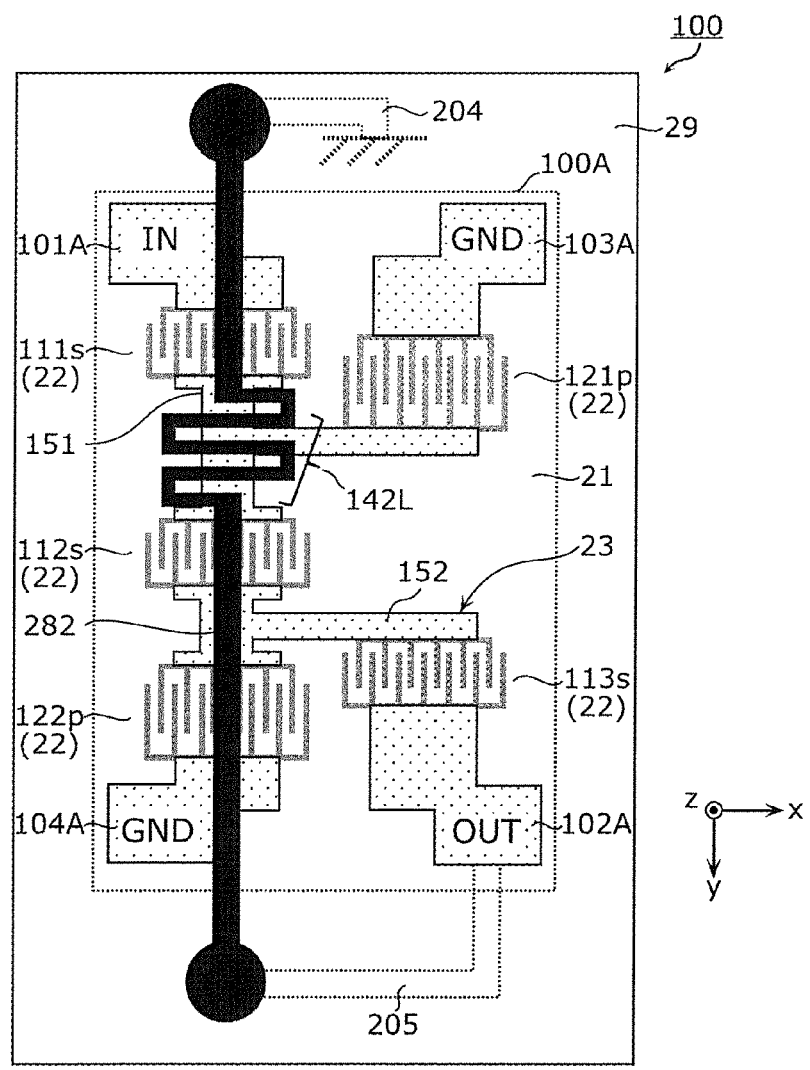
FIG. 3 is a plan perspective view of the high-frequency module according to Preferred Embodiment 1 of the present invention.

FIG. 3 is a plan perspective view of the high-frequency module 100 according to Preferred Embodiment 1. FIG. 3 is a perspective view of the high-frequency module 100 as seen from above the resin member 29 (the z-axis positive direction). Specifically, in FIG. 3, the wiring pattern 282, and the electrode pattern 23 seen through the resin member 29 and the piezoelectric substrate 21, are shown.

In the SAW filter 100A, the electrode pattern 23 shown in FIG. 3 is laid out on the front surface (the main surface at the z-axis negative direction side) of the piezoelectric substrate 21. The electrode pattern 23 includes the IDT electrodes 22 corresponding to the series resonators 111s, 112s, and 113s and the parallel resonators 121p and 122p, the connection wire 151 connecting the series resonators 111s and 112s to each other, and a connection wire 152 connecting the series resonators 112s and 113s to each other. Each element of the electrode pattern 23 may have an inductance component or a capacitance component when a high-frequency current flows therethrough. For example, the IDT electrodes 22 primarily have capacitance components, and the connection wires 151 and 152 primarily have inductance components.

The wiring pattern 282 overlap the SAW filter 100A when the module substrate 20 is seen in a plan view. Specifically, the wiring pattern 282 is provided on the resin member 29 so as to overlap a portion of the electrode pattern 23. Here, the wiring pattern 282 preferably includes a meandering-shaped portion (folded-shaped portion), for example. The meandering-shaped portion defines an inductor when a high-frequency current flows through the wiring pattern 282. In the present preferred embodiment, the meandering-shaped portion corresponds to the inductor 142L in FIG. 1.

In the present preferred embodiment, the meandering-shaped portion of the wiring pattern 282 and the connection wire 151 of the electrode pattern 23 overlap each other when seen from above the resin member 29 (the z-axis positive direction).

According to the above configuration, it is possible to inductively couple (C2 in FIG. 1), capacitively couple, or inductively couple and capacitively couple the meandering-shaped portion of the wiring pattern 282 and the connection wire 151 across a narrow gap with only the resin member 29 interposed therebetween. In this case, as a signal path through which a high-frequency signal propagates, a main signal path through which a high-frequency signal propagates from the input terminal 101 via the respective series resonators and the connection wires 151 and 152 to the output terminal 102 is provided, and a sub signal path through which a high-frequency signal propagates from the input terminal 101 to the connection wire 151 and the inductor 142L inductively coupled, capacitively coupled, or inductively coupled and capacitively coupled with the connection wire 151 is provided. Here, by adjusting the coupling degree of the inductive coupling C2, the capacitive coupling, or the inductive coupling and the capacitive coupling between the meandering-shaped portion of the wiring pattern 282 and the connection wire 151, it is possible to adjust the relationship of amplitude and phase between a signal component, outside the pass band, which passes through the main signal path and a signal component, outside the pass band, which passes through the sub signal path. Accordingly, it is possible to cancel the signal components outside the pass band.

Examples of the method for adjusting the coupling degree of the inductive coupling and the capacitive coupling preferably include (1) changing the thickness of the resin member 29 between the wiring pattern 282 and the connection wire 151 and (2) changing the areas and the lengths of the wiring pattern 282 and the connection wire 151 opposed to each other. In this case, the coupling degree decreases as the thickness of the resin member 29 between the wiring pattern 282 and the connection wire 151 increases. In addition, the coupling degree increases as the lengths and the areas of the wiring pattern 282 and the connection wire 151 opposed to each other increase.

Accordingly, it is possible to ensure strong coupling in a smaller space as compared to the case in which the electrode pattern 23 and the inner wiring pattern in the module substrate 20 are coupled with each other. By a propagation path for signals outside the pass band which is provided by the strong coupling, it is possible to improve the attenuation outside the pass band of the SAW filter 100A. Thus, it is possible to achieve size reduction while improving the attenuation characteristics outside the pass band of the surface acoustic wave filter.

A pair of elements that causes at least one of inductive coupling and capacitive coupling may be a pair of the meandering-shaped portion of the wiring pattern 282 and the connection wire 152 (C1 in FIG. 1) in addition to or instead of a pair of the meandering-shaped portion of the wiring pattern 282 and the connection wire 151.

In addition, the direction of a current flowing through the wiring pattern 282 and the direction of a current flowing through the portion of the electrode pattern 23 that overlaps the wiring pattern 282 are preferably the same.

Accordingly, it is possible to produce stronger coupling between a magnetic field generated by the wiring pattern 282 and a magnetic field generated by the portion of the electrode pattern 23. Thus, it is possible to further improve the attenuation characteristics outside the pass band of the SAW filter 100A.

In addition, the coupling between the wiring pattern 282 and the electrode pattern 23 is not limited to inductive coupling and may be capacitive coupling. Accordingly, a pair that causes the coupling may be, for example, a pair of the wiring pattern 282 and the IDT electrode 22. Furthermore, the portion of the electrode pattern 23 that is coupled with the wiring pattern 282 may be a portion obtained by combining the IDT electrode 22 and the connection wire.

The wiring pattern 282 is not limited to including the meandering-shaped portion as described above. The shape including an inductance component may be a spiral shape, a linear shape, or other suitable shape, for example. In addition, the wiring pattern 282 may have a shape including a capacitance component as appropriate.

In the present preferred embodiment, the configuration that improves the attenuation outside the pass band of the SAW filter 100A by coupling between elements between the input and output terminals connected to the single SAW filter 100A, is illustrated, but the configuration of the high-frequency modules according to preferred embodiments of the present invention is not limited thereto. The high-frequency module according to preferred embodiments of the present invention may have a configuration including a plurality of SAW filters defined by duplexers or dual filters, for example. In this case, for example, it is possible to improve isolation between the plurality of filters by coupling an electrode pattern of one SAW filter and a wiring pattern connected to another SAW filter, with each other.

Preferred Embodiment 2

Whereas the high-frequency module according to Preferred Embodiment 1 has a configuration to positively couple the electrode pattern of the SAW filter and the wiring pattern with each other, a high-frequency module according to Preferred Embodiment 2 of the present invention has the configuration in Preferred Embodiment 1 and a configuration to eliminates coupling between the electrode pattern of the SAW filter and the wiring pattern. Hereinafter, for the high-frequency module according to the present preferred embodiment, the description of the same points as the high-frequency module according to Preferred Embodiment 1 is omitted, and the differences therefrom will be primarily described.

Figure 4:
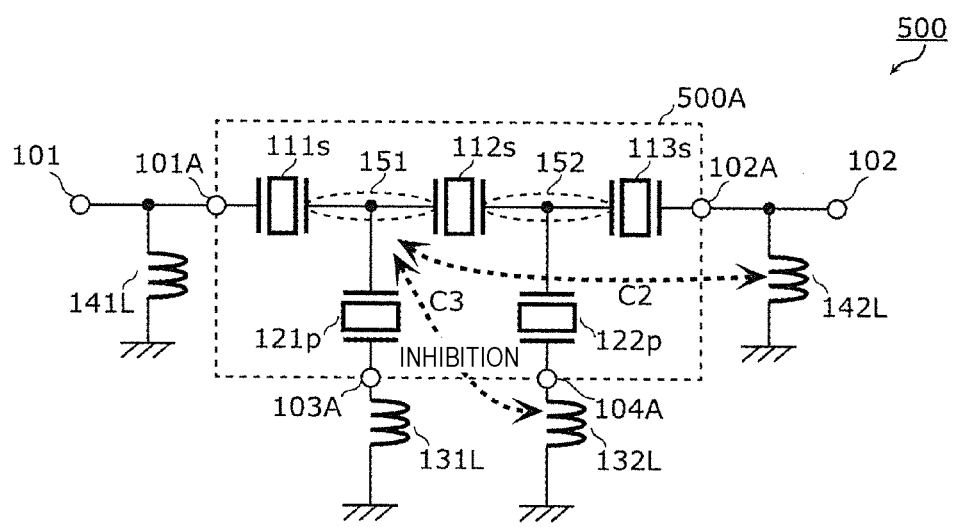
FIG. 4 is a circuit configuration diagram of a high-frequency module according to Preferred Embodiment 2 of the present invention.

FIG. 4 is a circuit configuration diagram of a high-frequency module 500 according to Preferred Embodiment 2. The high-frequency module 500 shown in FIG. 4 includes a SAW filter 500A, inductors 131L, 132L, 141L, and 142L connected to the SAW filter 500A, an input terminal 101, and an output terminal 102.

Figure 5:
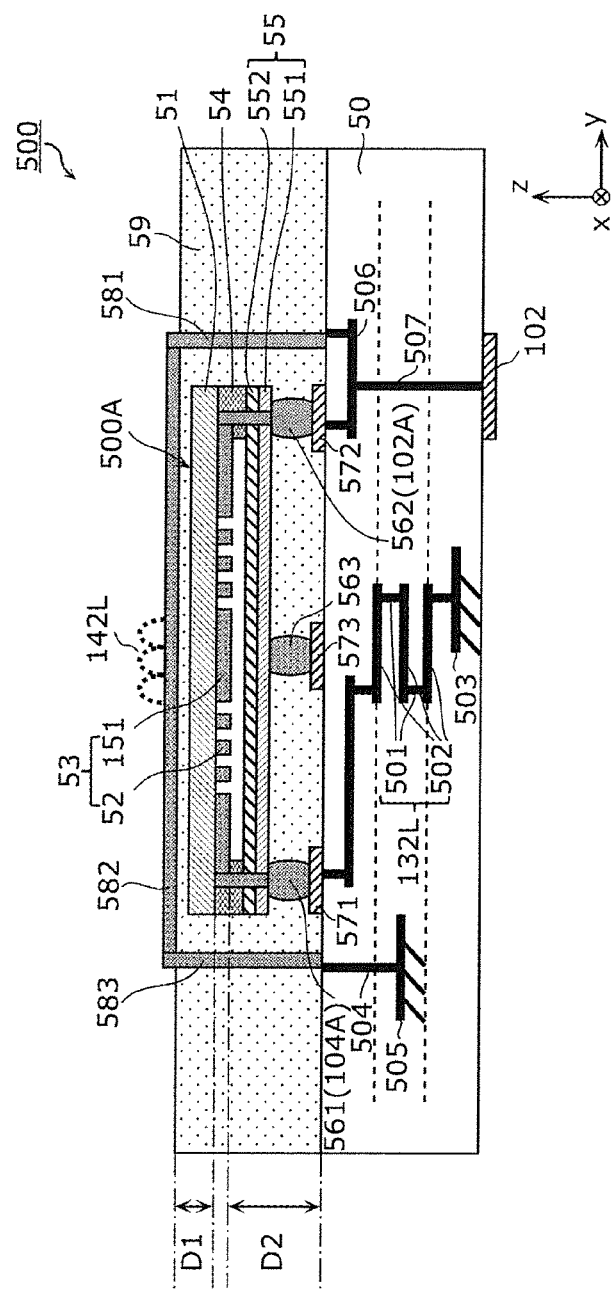
FIG. 5 is a cross-sectional structure diagram of the high-frequency module according to Preferred Embodiment 2 of the present invention.
Figure 6:
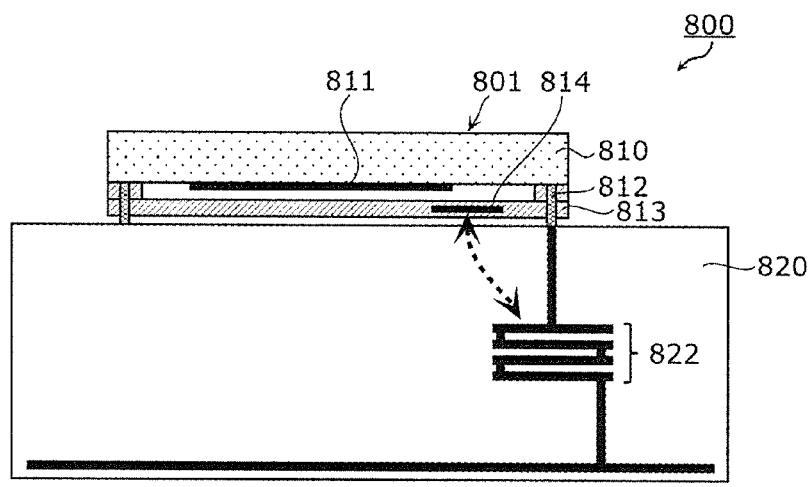
FIG. 6 is a cross-sectional structure diagram of a high-frequency module disclosed in Japanese Unexamined Patent Application Publication No. 2015-33080.

FIG. 5 is a cross-sectional structure diagram of the high-frequency module 500 according to Preferred Embodiment 2. As shown in FIG. 5, the high-frequency module 500 includes a module substrate 50, the SAW filter 500A, a resin member 59, and a wiring pattern 582.

The SAW filter 500A includes a piezoelectric substrate and an electrode pattern 53 provided on the piezoelectric substrate 51. The electrode pattern 53 includes IDT electrodes 52 having a comb shape and a connection wire 151 connecting the IDT electrodes 52. Each resonator shown in FIG. 4 includes the IDT electrode 52 and the piezoelectric substrate 51.

The SAW filter 500A according to the present preferred embodiment has a WLP structure and includes the piezoelectric substrate 51, the electrode pattern 53, a support member 54, and a cover member 551. A grounded shield electrode 552 is provided on the surface of the cover member 551 that is opposed to the piezoelectric substrate 51 (the back surface thereof). The cover member 551 and the shield electrode 552 define a cover 55. The cover member 551 is preferably defined by, for example, a polyimide film having a thickness of about 45 µm or a material including at least one of epoxy, urethane, phenol, polyester, BCB, and PBO. The shield electrode 552 is preferably made of, for example, a conductive metallic material such as copper, aluminum, silver, or gold and is provided on the front surface or the back surface of the cover member 551, for example, by vapor deposition or printing.

Due to this configuration, in the high-frequency module 500, the module substrate 50, the cover member 551, the piezoelectric substrate 51, and the wiring pattern 582 are disposed in order in a direction perpendicular or substantially perpendicular to the module substrate 50 (a z-axis direction).

According to this configuration, since the shield electrode 552 is disposed between the electrode pattern 53 of the WLP type SAW filter 500A and the inner wiring pattern provided in the module substrate 50, it is possible to reduce or prevent unwanted mutual interference between the SAW filter 500A and the inner wiring pattern. In addition, since the shield electrode 552 that reduces or prevents mutual interference does not need to be provided in or on the module substrate 50, it is possible to reduce the area of the module substrate 50. Thus, it is possible to reduce the size of the high-frequency module 500.

The module substrate 50 is preferably a multilayer substrate including a plurality of layers laminated therein, and examples thereof include a ceramics multilayer substrate and a PCB substrate. On the front surface of the module substrate 50, a surface electrode 571 connected to a bump 561 that defines a filter reference terminal 104A of the SAW filter 500A, a surface electrode 572 connected to a bump 562 that defines a filter output terminal 102A of the SAW filter 500A, and a surface electrode 573 connected to a bump 563 that defines another filter reference terminal (not shown) of the SAW filter 500A, are provided.

The surface electrode 571 is connected to a ground electrode 503 by a via-conductor 501 and an inner wiring pattern 502 provided in the module substrate 50. The via-conductor 501 and the inner wiring pattern 502 define a third inner wiring pattern defining a laminated coil and corresponds to the inductor 132L in FIG. 4. That is, the third inner wiring pattern is the inductor 132L connected to the electrode pattern 53 and connected to a parallel resonator 122p of the SAW filter 500A and a ground terminal.

On the back surface of the module substrate 50, an input terminal 101 (not shown) and an output terminal 102 are provided. The output terminal 102 is connected to the surface electrode 572 by a via-conductor 507 and an inner wiring pattern 506.

The resin member 59 covers the SAW filter 500A disposed on the module substrate 50.

The wiring pattern 582 is connected to the electrode pattern 53 and provided on the front surface of the resin member 59. Specifically, the wiring pattern 582 is connected to the electrode pattern 53 via a columnar conductor 581, the inner wiring pattern 506 (a first inner wiring pattern), the surface electrode 572, and the bump 562. Furthermore, the wiring pattern 582 is connected to a ground electrode 505 via a columnar conductor 583 and a via-conductor 504 (a second inner wiring pattern) in the module substrate 50. The columnar conductors 581 and 583 are preferably defined by, for example, Cu pillars.

Here, the wiring pattern 582 includes an inductance component and defines, for example, the inductor 142L in FIG. 4. That is, the wiring pattern 582 is a shunt inductor 142L connected to the output terminal 102 of the SAW filter 500A and the ground terminal.

The wiring pattern 582 may not be provided on the front surface of the resin member 59 and may be provided within the resin member 59.

In addition, as shown in FIG. 5, the distance D1 between the wiring pattern 582 and the electrode pattern 53 is smaller than the distance D2 between the module substrate 50 and the electrode pattern 53.

In addition, the wiring pattern 582 overlaps the SAW filter 500A when the module substrate 50 is seen in a plan view. Specifically, the wiring pattern 582 is provided on the resin member 59 so as to overlap a portion of the electrode pattern 53. Here, the wiring pattern 582 may preferably have a meandering-shaped portion (folded-shaped portion), for example. The meandering-shaped portion defines an inductor when a high-frequency current flows through the wiring pattern 582. The meandering-shaped portion corresponds to the inductor 142L in FIG. 4.

In the present preferred embodiment, the meandering-shaped portion of the wiring pattern 582 and the connection wire 151 of the electrode pattern 53 overlap each other when seen from above the resin member 59 (the z-axis positive direction).

According to the above configuration, it is possible to inductively couple (C2 in FIG. 4), capacitively couple, or inductively couple and capacitively couple the meandering-shaped portion of the wiring pattern 582 and the connection wire 151 across a narrow gap with only the resin member 59 interposed therebetween.

Accordingly, it is possible to ensure strong coupling in a smaller space as compared to the case in which the electrode pattern 53 and the inner wiring pattern in the module substrate 50 are coupled with each other. By a propagation path for signals outside the pass band which is defined by the strong coupling, it is possible to improve the attenuation outside the pass band of the SAW filter 500A. Thus, it is possible to achieve size reduction while improving the attenuation characteristics outside the pass band of the surface acoustic wave filter.

Furthermore, the shield electrode 552 overlaps the connection wire 151, which is a portion of the electrode pattern 53, when the module substrate 50 is seen in a plan view.

The third inner wiring pattern (inductor 132L) generates an attenuation pole outside the pass band of the SAW filter 500A by defining an LC resonant circuit together with a capacitance component of the SAW filter 500A. In addition, when the inductor 132L is inductively coupled, capacitively coupled, or inductively coupled and capacitively coupled with the connection wire 151, adverse effects, such as a decrease in the attenuation of the attenuation pole generated in a predetermined frequency region outside the pass band or a shift of the attenuation pole, may be caused.

On the other hand, in the high-frequency module 500 according to the present preferred embodiment, since the shield electrode 552 and the connection wire 151 overlap each other when the module substrate 50 is seen in a plan view, it is possible to reduce or prevent at least one of inductive coupling (C3 in FIG. 4) and capacitive coupling between the connection wire 151 and the third inner wiring pattern (inductor 132L). Thus, it is possible to more effectively reduce or prevent unwanted mutual interference between the electrode pattern 53 and the inner wiring pattern in the module substrate 50, and it is possible to reduce or prevent deterioration of the characteristics of the SAW filter 500A.

In addition, in the present preferred embodiment, a region in which the third inner wiring pattern (inductor 132L) and the electrode pattern 53 overlap each other (a region in which the inductor 132L and the connection wire 151 overlap each other), and the shield electrode 552 overlap each other when the module substrate 50 is seen in a plan view.

Accordingly, the shield electrode 552 is interposed in the region in which the electrode pattern 53 and the third inner wiring pattern overlap each other in the above plan view, and thus, it is possible to reduce or prevent unwanted mutual interference between the electrode pattern 53 and the third inner wiring pattern with high accuracy.

A pair of elements that causes at least one of inductive coupling and capacitive coupling may be a pair of the meandering-shaped portion of the wiring pattern 582 and the connection wire 152 in addition to or instead of a pair of the meandering-shaped portion of the wiring pattern 582 and the connection wire 151.

In addition, a pair of elements that reduce or prevent at least one of inductive coupling and capacitive coupling may be a pair of the inductor 131L and the connection wire 152 in addition to a pair of the inductor 132L and the connection wire 151.

In addition, the direction of a current flowing through the wiring pattern 582 and the direction of a current flowing through the portion of the electrode pattern 53 that overlaps the wiring pattern 582 are preferably the same. Accordingly, it is possible to produce stronger coupling between a magnetic field generated by the wiring pattern 582 and a magnetic field generated by the portion of the electrode pattern 53. Thus, it is possible to further improve the attenuation characteristics outside the pass band of the SAW filter 500A.

In addition, the coupling between the wiring pattern 582 and the electrode pattern 53 is not limited to inductive coupling and may be capacitive coupling. Accordingly, a pair that causes the coupling may be, for example, a pair of the wiring pattern 582 and the IDT electrode 52.

In addition, coupling that is reduced or prevent between the third inner wiring pattern and the electrode pattern 53 is not limited to inductive coupling and may be capacitive coupling. Accordingly, a pair between which the coupling is reduced or prevented may be a pair of the third inner wiring pattern and the IDT electrode 52.

The shield electrode 552 may be provided on the entirety or substantially the entirety of the surface (back surface) of the cover member 551 that is opposed to the piezoelectric substrate 51, or may be provided on a portion of the back surface. In addition, the shield electrode 552 may be provided on the entirety or substantially the entirety of the surface (front surface) of the cover member 551 that is opposed to the module substrate 50, or may be provided on a portion of the front surface.

Although the high-frequency modules according to various preferred embodiments of the present invention have been described in connection with Preferred Embodiments 1 and 2, the high-frequency module of the present invention is not limited to the above-described preferred embodiments. Other preferred embodiments obtained by optionally combining the elements in the above-described preferred embodiments, modifications obtained by making various variations conceived by those skilled in the art for the above-described preferred embodiments without departing from the spirit of the present invention, and various devices including the high-frequency module of the present disclosure are also included in the present invention.

In the high-frequency modules according to the above-described preferred embodiments, another high-frequency circuit element, wire, and other component may be inserted between paths connecting the respective circuit elements and the signal paths disclosed in the drawings.

Preferred embodiments of the present invention are widely usable as a high-frequency module disposed at a front end portion that supports multiband/multimode features, in communication devices, such as a cellular phone, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
    a module substrate;
    a surface acoustic wave filter disposed on a main surface of the module substrate and including a piezoelectric substrate and an electrode pattern provided on the piezoelectric substrate;
    a resin member covering the surface acoustic wave filter; and
    a wiring pattern connected to the electrode pattern and provided in or on the resin member; wherein
    the electrode pattern and the wiring pattern are inductively coupled, capacitively coupled, or inductively coupled and capacitively coupled with each other.

2. The high-frequency module according to claim 1, wherein the wiring pattern is provided in or on the resin member so as to overlap a portion of the electrode pattern when the main surface is seen in a plan view.

3. The high-frequency module according to claim 1, wherein a distance between the wiring pattern and the electrode pattern is smaller than a distance between the main surface and the electrode pattern when the module substrate is seen in cross-section.

4. The high-frequency module according to claim 1, wherein
the wiring pattern is a shunt inductor connected to an input/output terminal of the surface acoustic wave filter and a ground terminal; and
the wiring pattern and the electrode pattern are inductively coupled, capacitively coupled, or inductively coupled and capacitively coupled with each other.

5. The high-frequency module according to claim 4, wherein
the electrode pattern and the wiring pattern are connected to each other via a first inner wiring pattern in the module substrate and a first columnar conductor penetrating the resin member; and
the wiring pattern and the ground terminal are connected to each other via a second columnar conductor penetrating the resin member and a second inner wiring pattern in the module substrate.

6. The high-frequency module according to claim 5, wherein the first and second columnar conductors are Cu pillars.

7. The high-frequency module according to claim 1, wherein
the surface acoustic wave filter further includes a support member provided on a front surface of the piezoelectric substrate so as to surround the electrode pattern, and a cover member provided on the support member and covering the electrode pattern so as to define a hollow space together with the support member and the piezoelectric substrate; and
the module substrate, the cover member, the piezoelectric substrate, and the wiring pattern are disposed in order in a direction perpendicular or substantially perpendicular to the main surface.

8. The high-frequency module according to claim 7, wherein a grounded shield electrode is provided on a surface of the cover member that is opposed to the module substrate or on a surface of the cover member that is opposed to the piezoelectric substrate.

9. The high-frequency module according to claim 8, wherein the shield electrode overlaps at least a portion of the electrode pattern when the module substrate is seen in a plan view.

10. The high-frequency module according to claim 8, wherein the shield electrode overlaps a region in which a third inner wiring pattern in the module substrate and the electrode pattern overlap each other, when the module substrate is seen in a plan view.

11. The high-frequency module according to claim 10, wherein
the third inner wiring pattern is an inductor connected to the electrode pattern and connected to a parallel resonator of the surface acoustic wave filter and the ground terminal; and
inductive coupling, capacitive coupling, or inductive coupling and capacitive coupling between the third inner wiring pattern and the electrode pattern are reduced or prevented by the shield electrode.

12. The high-frequency module according to claim 1, wherein
the surface acoustic wave filter is a ladder band pass filter that includes series resonators and parallel resonators;
the series resonators are connected in series to each other between an input terminal and an output terminal of the surface acoustic wave filter; and
the parallel resonators are connected in parallel to each other between respective connection points of the series resonators and filter ground terminals of the surface acoustic wave filter.

13. The high-frequency module according to claim 1, wherein the surface acoustic wave filter has a wafer level package structure.

14. The high-frequency module according to claim 1, wherein the module substrate is a multilayer substrate including a plurality of layers laminated therein.

15. The high-frequency module according to claim 14, wherein the multilayer substrate is a multilayer ceramic substrate.

16. The high-frequency module according to claim 1, wherein the resin member is made of thermosetting epoxy resin.

17. The high-frequency module according to claim 1, wherein the wiring pattern includes a meandering-shaped portion.

* * * * *